(12) United States Patent
Johnson

(10) Patent No.: US 11,343,439 B2
(45) Date of Patent: May 24, 2022

(54) HIGH DYNAMIC RANGE IMAGING PIXELS WITH MULTIPLE PHOTODIODES

(71) Applicant: SEMICONDUCTOR COMPONENTS INDUSTRIES, LLC, Phoenix, AZ (US)

(72) Inventor: Richard Scott Johnson, Boise, ID (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 339 days.

(21) Appl. No.: 16/776,849

(22) Filed: Jan. 30, 2020

(65) Prior Publication Data
US 2021/0243350 A1   Aug. 5, 2021

(51) Int. Cl.
| | | |
|---|---|---|
| H04N 5/235 | (2006.01) |
| H04N 5/355 | (2011.01) |
| H04N 5/357 | (2011.01) |
| H04N 5/369 | (2011.01) |
| H04N 5/374 | (2011.01) |
| H04N 5/378 | (2011.01) |
| H01L 27/146 | (2006.01) |

(52) U.S. Cl.
CPC ....... *H04N 5/2355* (2013.01); *H01L 27/1461* (2013.01); *H01L 27/14643* (2013.01)

(58) Field of Classification Search
CPC .... H04N 5/2355; H04N 5/378; H04N 5/3745; H04N 5/3559; H04N 5/357; H04N 5/36955; H04N 5/37452; H04N 5/3591; H04N 5/35563; H04N 9/0451; H01L 27/1461; H01L 27/14

USPC ........... 348/207.99, 308, 294, 297; 250/291, 250/292, 293, 443; 257/208.1
See application file for complete search history.

(56) References Cited

U.S. PATENT DOCUMENTS

| | | | |
|---|---|---|---|
| 9,332,200 B1 * | 5/2016 | Hseih .................... | H04N 5/363 |
| 9,843,745 B2 | 12/2017 | Geurts | |
| 10,834,342 B2 * | 11/2020 | Johnson ................ | H04N 5/341 |
| 2004/0096124 A1 * | 5/2004 | Nakamura ......... | H04N 5/35554 348/308 |

(Continued)

OTHER PUBLICATIONS

Iida et al. "A 0.68e-rms Random-Noise 121dB Dynamic Range Sub-Pixel Architecture CMOS Image Sensor with LED Flicker Mitigation." 2018 IEEE International Electronic Devices Meeting (IEDM). Dec. 1, 2018.

*Primary Examiner* — Marly S Camargo
(74) *Attorney, Agent, or Firm* — Treyz Law Group, P.C.; Joseph F. Guihan

(57) ABSTRACT

A high dynamic range imaging pixel may include first and second photodiodes that generate charge in response to incident light. The second photodiode may have a higher sensitivity than the first photodiode. When generated charge in the first photodiode exceeds a given charge level, the charge may overflow through a transistor to a capacitor. The overflow path from the first photodiode to the capacitor may optionally pass through the floating diffusion region. A transistor may be coupled between the first and second photodiodes. A gain select transistor may be coupled between the floating diffusion region and the capacitor. After sampling the overflow charge, the charge from both the first and second photodiodes may be sampled. In one arrangement, overflow charge may be transferred to a capacitor in a subsequent row.

20 Claims, 8 Drawing Sheets

(56) References Cited

U.S. PATENT DOCUMENTS

| | | |
|---|---|---|
| 2014/0246561 A1 | 9/2014 | Chen et al. |
| 2017/0324951 A1* | 11/2017 | Geurts ................. H04N 5/3532 |
| 2018/0124335 A1* | 5/2018 | Makida ................ H04N 5/3745 |
| 2020/0154066 A1* | 5/2020 | Johnson ............... H04N 5/3559 |
| 2020/0204749 A1* | 6/2020 | Mori .................... H04N 5/3559 |
| 2020/0227454 A1* | 7/2020 | Geurts .............. H01L 27/14614 |
| 2020/0286945 A1* | 9/2020 | Palaniappan ...... H04N 5/35572 |
| 2020/0296336 A1* | 9/2020 | Higashitsutsumi .. H04N 9/0451 |

\* cited by examiner

HIGH DYNAMIC RANGE IMAGING PIXELS WITH MULTIPLE PHOTODIODES

BACKGROUND

This relates generally to imaging devices, and more particularly, to imaging devices having high dynamic range imaging pixels.

Image sensors are commonly used in electronic devices such as cellular telephones, cameras, and computers to capture images. In a typical arrangement, an image sensor includes an array of image pixels arranged in pixel rows and pixel columns. Circuitry may be coupled to each pixel column for reading out image signals from the image pixels. Typical image pixels contain a photodiode for generating charge in response to incident light. Image pixels may also include a charge storage region for storing charge that is generated in the photodiode. Image sensors can operate using a global shutter or a rolling shutter scheme.

Some conventional image sensors may be able to operate in a high dynamic range (HDR) mode. HDR operation may be accomplished in image sensors by assigning alternate rows of pixels different integration times. However, conventional HDR image sensors may sometimes experience lower than desired resolution, lower than desired sensitivity, higher than desired noise levels, and lower than desired quantum efficiency.

It would therefore be desirable to be able to provide improved high dynamic range operation in image sensors.

DETAILED DESCRIPTION

Embodiments of the present invention relate to image sensors. It will be recognized by one skilled in the art that the present exemplary embodiments may be practiced without some or all of these specific details. In other instances, well-known operations have not been described in detail in order not to unnecessarily obscure the present embodiments.

Electronic devices such as digital cameras, computers, cellular telephones, and other electronic devices may include image sensors that gather incoming light to capture an image. The image sensors may include arrays of pixels. The pixels in the image sensors may include photosensitive elements such as photodiodes that convert the incoming light into image signals. Image sensors may have any number of pixels (e.g., hundreds or thousands or more). A typical image sensor may, for example, have hundreds of thousands or millions of pixels (e.g., megapixels). Image sensors may include control circuitry such as circuitry for operating the pixels and readout circuitry for reading out image signals corresponding to the electric charge generated by the photosensitive elements.

Figure 1:
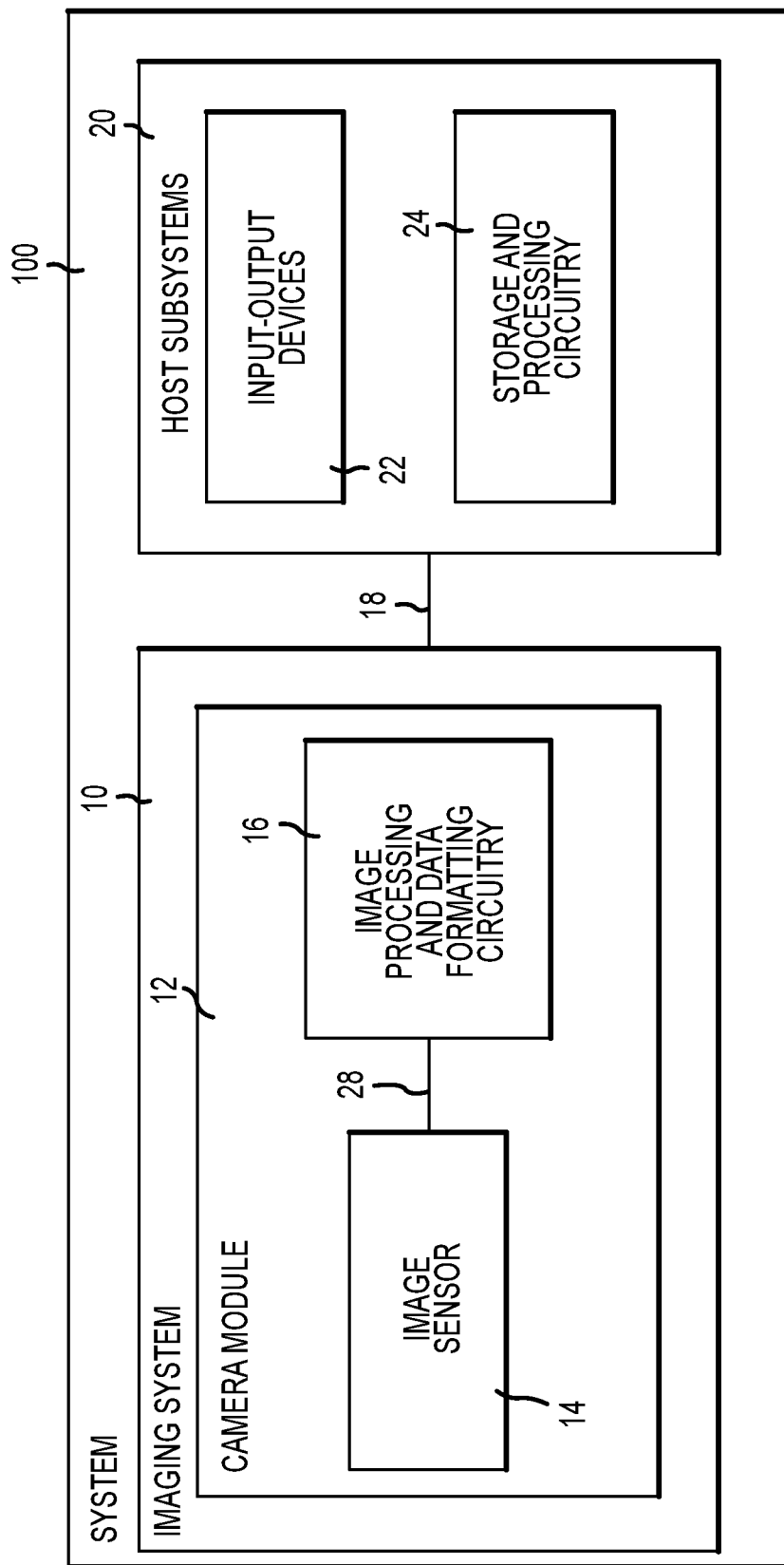
FIG. 1 is a diagram of an illustrative electronic device having an image sensor in accordance with an embodiment.

FIG. 1 is a diagram of an illustrative imaging and response system including an imaging system that uses an image sensor to capture images. System 100 of FIG. 1 may be an electronic device such as a camera, a cellular telephone, a video camera, or other electronic device that captures digital image data, may be a vehicle safety system (e.g., an active braking system or other vehicle safety system), may be a surveillance system, or may be any other desired type of system.

As shown in FIG. 1, system 100 may include an imaging system such as imaging system 10 and host subsystems such as host subsystem 20. Imaging system 10 may include camera module 12. Camera module 12 may include one or more image sensors 14 and one or more lenses.

Each image sensor in camera module 12 may be identical or there may be different types of image sensors in a given image sensor array integrated circuit. During image capture operations, each lens may focus light onto an associated image sensor 14. Image sensor 14 may include photosensitive elements (i.e., pixels) that convert the light into digital data. Image sensors may have any number of pixels (e.g., hundreds, thousands, millions, or more). A typical image sensor may, for example, have millions of pixels (e.g., megapixels). As examples, image sensor 14 may include bias circuitry (e.g., source follower load circuits), sample and hold circuitry, correlated double sampling (CDS) circuitry, amplifier circuitry, analog-to-digital converter circuitry, data output circuitry, memory (e.g., buffer circuitry), address circuitry, etc.

Still and video image data from camera sensor 14 may be provided to image processing and data formatting circuitry 16 via path 28. Path 28 may be a connection through a serializer/deserializer (SERDES) which is used for high speed communication and may be especially useful in automotive systems. Image processing and data formatting circuitry 16 may be used to perform image processing functions such as data formatting, adjusting white balance and exposure, implementing video image stabilization, face detection, etc. Image processing and data formatting circuitry 16 may also be used to compress raw camera image files if desired (e.g., to Joint Photographic Experts Group or JPEG format). In a typical arrangement, which is sometimes referred to as a system on chip (SOC) arrangement, camera sensor 14 and image processing and data formatting circuitry 16 are implemented on a common semiconductor substrate (e.g., a common silicon image sensor integrated circuit die). If desired, camera sensor 14 and image processing circuitry 16 may be formed on separate semiconductor substrates. For example, camera sensor 14 and image processing circuitry 16 may be formed on separate substrates that have been stacked.

Imaging system 10 (e.g., image processing and data formatting circuitry 16) may convey acquired image data to host subsystem 20 over path 18. Path 18 may also be a connection through SERDES. Host subsystem 20 may include processing software for detecting objects in images, detecting motion of objects between image frames, determining distances to objects in images, filtering or otherwise processing images provided by imaging system 10.

If desired, system 100 may provide a user with numerous high-level functions. In a computer or advanced cellular telephone, for example, a user may be provided with the ability to run user applications. To implement these functions, host subsystem 20 of system 100 may have input-output devices 22 such as keypads, input-output ports, joysticks, and displays and storage and processing circuitry 24. Storage and processing circuitry 24 may include volatile and nonvolatile memory (e.g., random-access memory, flash memory, hard drives, solid-state drives, etc.). Storage and processing circuitry 24 may also include microprocessors, microcontrollers, digital signal processors, application specific integrated circuits, etc.

Figure 2:
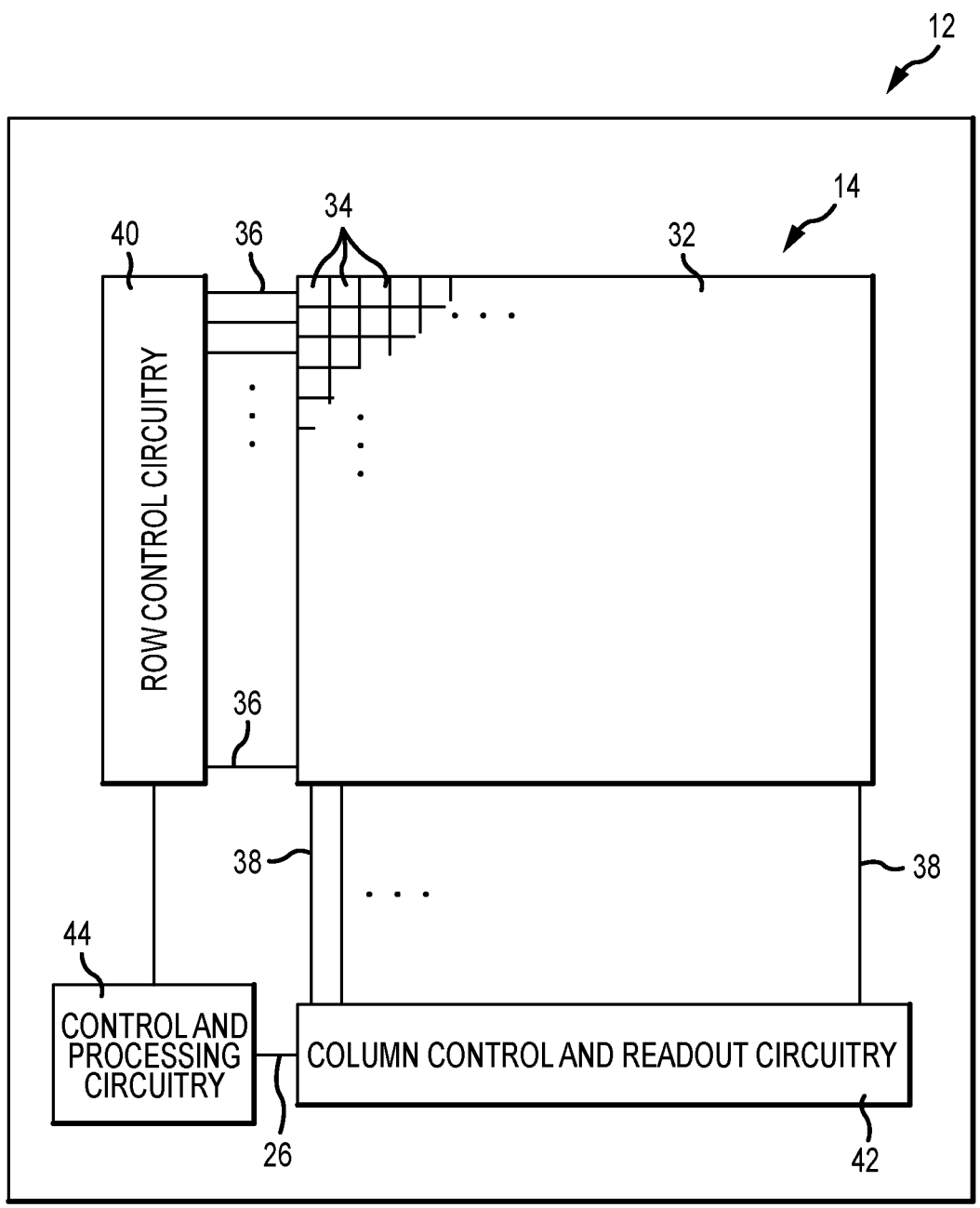
FIG. 2 is a diagram of an illustrative pixel array and associated readout circuitry for reading out image signals in an image sensor in accordance with an embodiment.

An example of an arrangement for camera module 12 of FIG. 1 is shown in FIG. 2. As shown in FIG. 2, camera module 12 includes image sensor 14 and control and processing circuitry 44. Control and processing circuitry 44 may correspond to image processing and data formatting circuitry 16 in FIG. 1. Image sensor 14 may include a pixel array such as array 32 of pixels 34 (sometimes referred to herein as image sensor pixels, imaging pixels, or image pixels 34) and may also include control circuitry 40 and 42. Control and processing circuitry 44 may be coupled to row control circuitry 40 and may be coupled to column control and readout circuitry 42 via data path 26. Row control circuitry 40 may receive row addresses from control and processing circuitry 44 and may supply corresponding row control signals to image pixels 34 over control paths 36 (e.g., dual conversion gain control signals, pixel reset control signals, charge transfer control signals, blooming control signals, row select control signals, or any other desired pixel control signals). Column control and readout circuitry 42 may be coupled to the columns of pixel array 32 via one or more conductive lines such as column lines 38. Column lines 38 may be coupled to each column of image pixels 34 in image pixel array 32 (e.g., each column of pixels may be coupled to a corresponding column line 38). Column lines 38 may be used for reading out image signals from image pixels 34 and for supplying bias signals (e.g., bias currents or bias voltages) to image pixels 34. During image pixel readout operations, a pixel row in image pixel array 32 may be selected using row control circuitry 40 and image data associated with image pixels 34 of that pixel row may be read out by column control and readout circuitry 42 on column lines 38.

Column control and readout circuitry 42 may include column circuitry such as column amplifiers for amplifying signals read out from array 32, sample and hold circuitry for sampling and storing signals read out from array 32, analog-to-digital converter circuits for converting read out analog signals to corresponding digital signals, and column memory for storing the read out signals and any other desired data. Column control and readout circuitry 42 may output digital pixel values to control and processing circuitry 44 over line 26.

Array 32 may have any number of rows and columns. In general, the size of array 32 and the number of rows and columns in array 32 will depend on the particular implementation of image sensor 14. While rows and columns are generally described herein as being horizontal and vertical, respectively, rows and columns may refer to any grid-like structure (e.g., features described herein as rows may be arranged vertically and features described herein as columns may be arranged horizontally).

Pixel array 32 may be provided with a color filter array having multiple color filter elements which allows a single image sensor to sample light of different colors. As an example, image sensor pixels such as the image pixels in array 32 may be provided with a color filter array which allows a single image sensor to sample red, green, and blue (RGB) light using corresponding red, green, and blue image sensor pixels arranged in a Bayer mosaic pattern. The Bayer mosaic pattern consists of a repeating unit cell of two-by-two image pixels, with two green image pixels diagonally opposite one another and adjacent to a red image pixel diagonally opposite to a blue image pixel. In another suitable example, the green pixels in a Bayer pattern are replaced by broadband image pixels having broadband color filter elements (e.g., clear color filter elements, yellow color filter elements, etc.). These examples are merely illustrative and, in general, color filter elements of any desired color and in any desired pattern may be formed over any desired number of image pixels 34.

If desired, array 32 may be part of a stacked-die arrangement in which pixels 34 of array 32 are split between two or more stacked substrates. In such an arrangement, each of the pixels 34 in the array 32 may be split between the two dies at any desired node within the pixel. As an example, a node such as the floating diffusion node may be formed across two dies. Pixel circuitry that includes the photodiode and the circuitry coupled between the photodiode and the desired node (such as the floating diffusion node, in the present example) may be formed on a first die, and the remaining pixel circuitry may be formed on a second die. The desired node may be formed on (i.e., as a part of) a coupling structure (such as a conductive pad, a micro-pad, a conductive interconnect structure, or a conductive via) that connects the two dies. Before the two dies are bonded, the coupling structure may have a first portion on the first die and may have a second portion on the second die. The first die and the second die may be bonded to each other such that first portion of the coupling structure and the second portion of the coupling structure are bonded together and are electrically coupled. If desired, the first and second portions of the coupling structure may be compression bonded to each other. However, this is merely illustrative. If desired, the first and second portions of the coupling structures formed on the respective first and second dies may be bonded together using any metal-to-metal bonding technique, such as soldering or welding.

As mentioned above, the desired node in the pixel circuit that is split across the two dies may be a floating diffusion node. Alternatively, the desired node in the pixel circuit that is split across the two dies may be the node between a floating diffusion region and the gate of a source follower transistor (i.e., the floating diffusion node may be formed on the first die on which the photodiode is formed, while the coupling structure may connect the floating diffusion node to the source follower transistor on the second die), the node between a floating diffusion region and a source-drain node of a transfer transistor (i.e., the floating diffusion node may be formed on the second die on which the photodiode is not located), the node between a source-drain node of a source follower transistor and a row select transistor, or any other desired node of the pixel circuit.

In general, array 32, row control circuitry 40, column control and readout circuitry 42, and control and processing circuitry 44 may be split between two or more stacked substrates. In one example, array 32 may be formed in a first substrate and row control circuitry 40, column control and readout circuitry 42, and control and processing circuitry 44 may be formed in a second substrate. In another example, array 32 may be split between first and second substrates (using one of the pixel splitting schemes described above) and row control circuitry 40, column control and readout circuitry 42, and control and processing circuitry 44 may be formed in a third substrate.

To increase high dynamic range in imaging pixels, an imaging pixel may include first and second photosensitive areas with different sensitivities. A high sensitivity photodiode may be optimal for sensor performance in low light conditions whereas a low sensitivity photodiode may be optimal for sensor performance in high light conditions. Including a high sensitivity photodiode and a low sensitivity photodiode in a single pixel may therefore improve dynamic range. An imaging pixel of this type (with two discrete photosensitive areas) may sometimes be referred to as a split pixel.

To increase high dynamic range in imaging pixels, imaging pixels may also be formed with an overflow capacitor. The photodiodes for the imaging pixel generate charge. After the charge exceeds a certain level, the excess charge may overflow from one of the photodiodes into a storage capacitor. The charge from both the storage capacitor and the photodiodes may be read out after the integration time is complete. This effectively increases the dynamic range of the pixel. The storage capacitor in these types of pixels may be referred to as an overflow capacitor.

Figure 3:
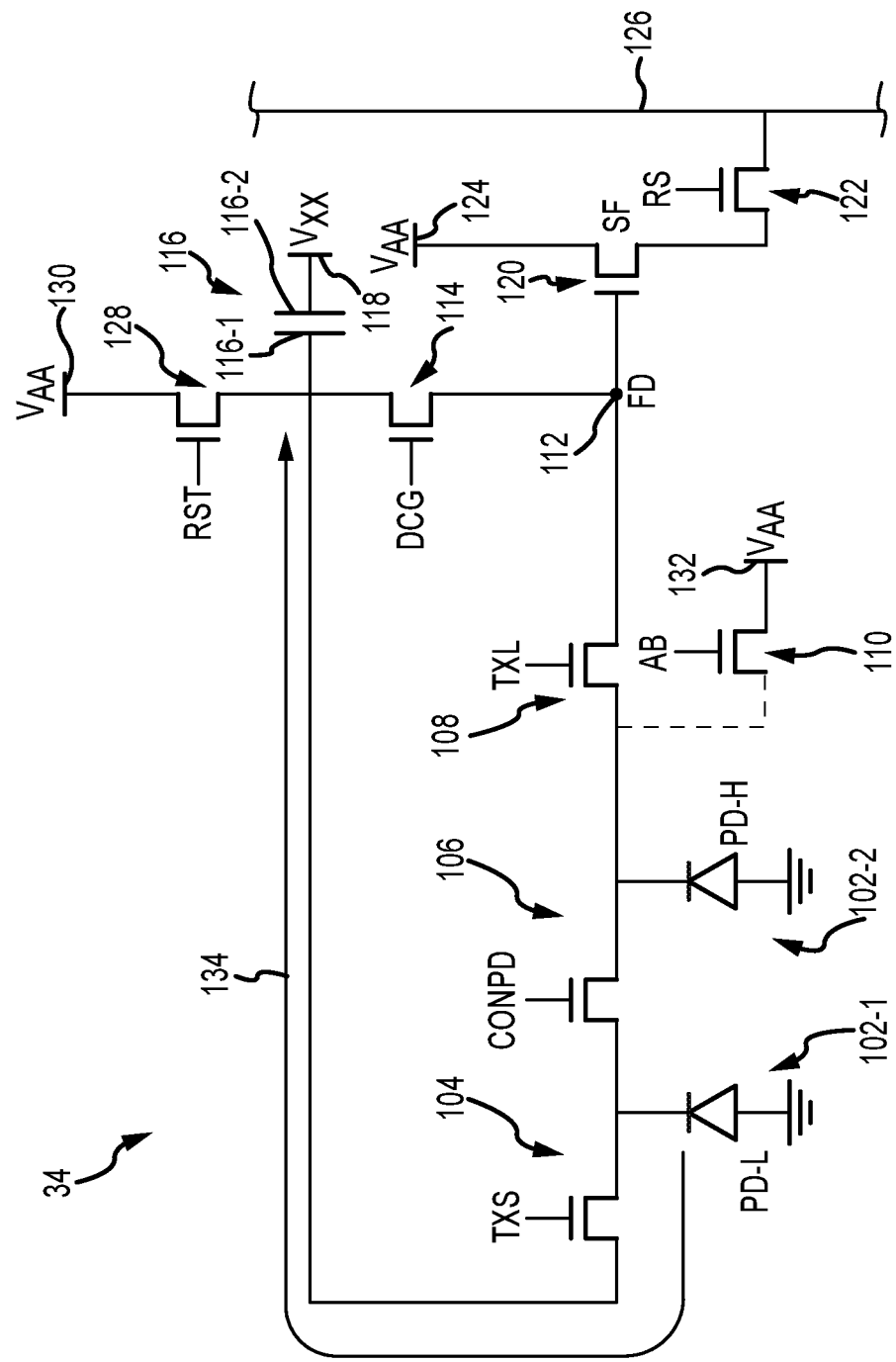
FIG. 3 is a circuit diagram of an illustrative imaging pixel that includes an overflow capacitor and connected photodiodes having different sensitivities in accordance with an embodiment.

FIG. 3 is a circuit diagram of an imaging pixel having a photosensitive element and a storage capacitor. As shown in FIG. 3, image pixel 34 includes photosensitive elements 102-1 and 102-2 (e.g., photodiodes). Photosensitive element 102-1 (sometimes referred to as low-sensitivity photodiode PD-L) has a first terminal that is coupled to ground. The second terminal of photosensitive element 102-1 is coupled to transistor 104 and transistor 106. Photosensitive element 102-2 (sometimes referred to as high-sensitivity photodiode PD-H) has a first terminal that is coupled to ground. The second terminal of photosensitive element 102-2 is coupled to transistor 106 and transistor 108. Transistor 110 may also optionally be coupled to photodiode 102-2.

The sensitivities of photodiodes 102-1 and 102-2 may be varied in a number of ways. As an example, the doping concentrations of photodiodes 102-1 and 102-2 may be modified to control the sensitivity, electrostatics, or other aspects of the photodiodes. In another example, the surface area (e.g., light collecting area) of photodiodes 102-1 and 102-2 may be modified to control the sensitivity of the photodiodes. Different microlens arrangements may also be used to control the sensitivity of the photodiodes. Therefore, photodiodes 102-1 and 102-2 may have different doping concentrations, light collecting areas, and/or microlens arrangements. Photosensitive areas 102-1 and 102-2 may be composed of multiple photodiodes in parallel with parallel connecting transistors 104, 106, 108, and 110. The sensitivity ratio of the high-sensitivity photodiode to the low-sensitivity photodiode may be at least 3 to 2, at least 2 to 1, at least 3 to 1, at least 4 to 1, at least 5 to 1, at least 10 to 1, less than 5 to 1, any intermediate ratio, any larger ratio, etc.

Transistor 104 (sometimes referred to as threshold transistor 104) is coupled between photodiode 102-1 and storage capacitor 116. Transistor 106 is coupled between photodiodes 102-1 and 102-2. Transistor 108 is coupled between photodiode 102-2 and floating diffusion (FD) region 112. Floating diffusion region 112 may be a doped semiconductor region (e.g., a region in a silicon substrate that is doped by ion implantation, impurity diffusion, or other doping process). Gain select transistor 114 has a first terminal coupled to floating diffusion region 112 and a second terminal coupled to storage capacitor 116. Floating diffusion 112 has an associated capacitance. Dual conversion gain capacitor 116 may have a first plate 116-1 (sometimes referred to as an upper plate or top plate) coupled to the second terminal of the gain select transistor. Dual conversion gain capacitor 116 may have a second plate 116-2 (sometimes referred to as a lower plate or bottom plate) that is coupled to bias voltage supply terminal 118. Voltage supply 118 may provide a voltage $V_{xx}$.

Source follower transistor 120 has a gate terminal coupled to floating diffusion region 112. Source follower transistor 120 also has a first source-drain terminal coupled to voltage supply 124. Voltage supply 124 may provide a power supply voltage $V_{AA}$. In this application, each transistor is illustrated as having three terminals: a source, a drain, and a gate. The source and drain terminals of each transistor may be changed depending on how the transistors are biased and the type of transistor used. For the sake of simplicity, the source and drain terminals are referred to herein as source-drain terminals or simply terminals. A second source-drain terminal of source follower transistor 120 is coupled to column output line 126 through row select transistor 122. The source follower transistor, row select transistor, and column output line may sometimes collectively be referred to as a readout circuit or as readout circuitry.

Reset transistor 128 may be coupled between gain transistor 114 and voltage supply 130. Voltage supply 130 may provide a voltage $V_{AA}$. Anti-blooming transistor 110 may optionally be coupled between photodiode 102-2 and bias voltage supply terminal 132. Voltage supply 132 may provide a voltage $V_{AA}$. The bias voltage provided at bias voltage supply terminals 118, 124, 130, and 132 may be the same or may be different.

A gate terminal of transistor 104 (sometimes referred to as transfer transistor 104 or threshold transistor 104) receives control signal TXS. A gate terminal of transistor 106 (sometimes referred to as transfer transistor 106 or connecting transistor 106) receives control signal CONPD. A gate terminal of transistor 108 (sometimes referred to as transfer transistor 108) receives control signal TXL. A gate terminal of transistor 128 (sometimes referred to as reset transistor 128) receives control signal RST. A gate terminal of transistor 122 (sometimes referred to as row select transistor 122) receives control signal RS. A gate terminal of transistor 110 (sometimes referred to as anti-blooming transistor 110) receives control signal AB. A gate terminal of transistor 114 (sometimes referred to as gain transistor 114, conversion gain transistor 114, gain select transistor 114, conversion gain select transistor 114, etc.) receives control signal DCG. Control signals TXS, CONPD, TXL, RST, RS, AB, and DCG may be provided by row control circuitry (e.g., row control circuitry 40 in FIG. 2) over control paths (e.g., control paths 36 in FIG. 2).

Gain select transistor 114 and dual conversion gain capacitor 116 may be used by pixel 34 to implement a dual conversion gain mode. In particular, pixel 34 may be operable in a high conversion gain mode and in a low conversion gain mode. If gain select transistor 114 is disabled, pixel 34 will be placed in a high conversion gain mode. If gain select transistor 114 is enabled, pixel 34 will be placed in a low conversion gain mode. When gain select transistor 114 is turned on, the dual conversion gain capacitor 116 may be switched into use to provide floating diffusion region 112 with additional capacitance. This results in lower conversion gain for pixel 34. When gain select transistor 114 is turned off, the additional loading of the capacitor is removed and the pixel reverts to a relatively higher pixel conversion gain configuration.

To allow charge from photodiode 102-1 to overflow to storage capacitor 116 and increase dynamic range of pixel 34, control signal TXS for threshold transistor 104 may be set to an intermediate voltage level during the integration time of the pixel. When the charge levels in photodiode 102-1 exceed a given level (set by control signal TXS), charge may overflow into capacitor 116. For example, the overflow charge may follow path 134.

Including storage capacitor 116 in the imaging pixel increases the dynamic range of the pixel relative to embodiments where the storage capacitor is not included. Additionally, including a low-sensitivity photodiode 102-1 and a high-sensitivity photodiode 102-2 increases the dynamic range of the pixel relative to embodiments where the storage capacitor is not included. Transistor 106 between photodiodes 102-1 and 102-2 may increase the signal-to-noise ratio (SNR) or pixel 34 relative to embodiments where the transistor is not included.

Figure 4:
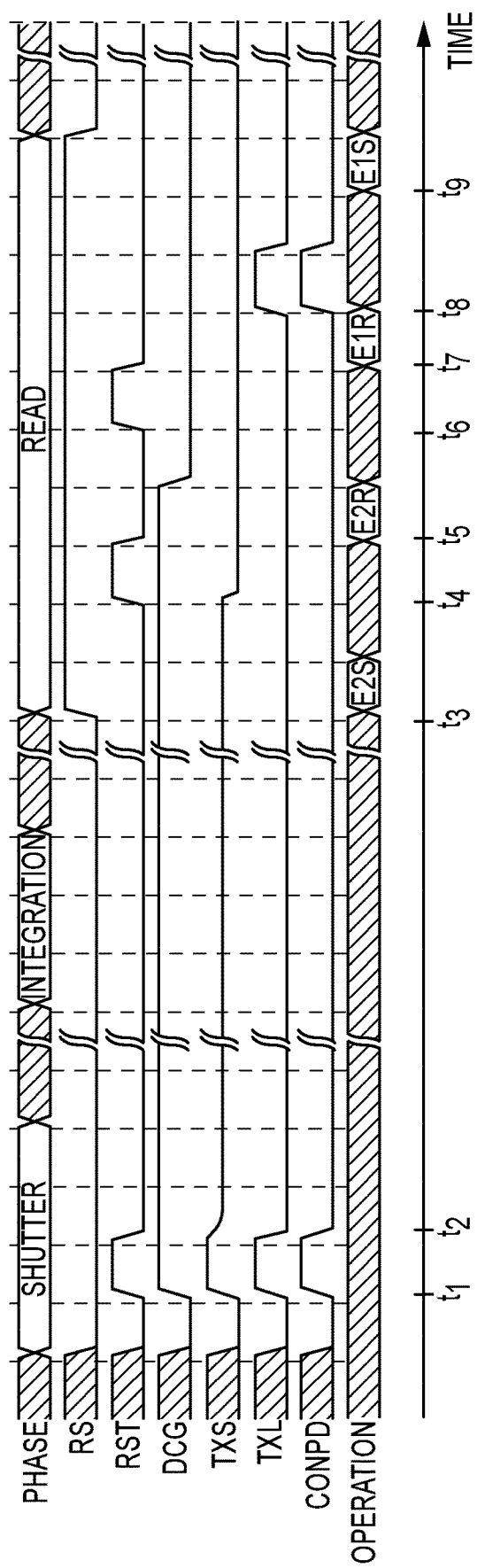
FIG. 4 is a timing diagram showing an illustrative method of operation for the imaging pixel of FIG. 3 in accordance with an embodiment.

FIG. 4 is a timing diagram showing an illustrative method of operating the pixel of FIG. 3. The timing diagram shown in FIG. 4 may be performed for each pixel during a respective frame. As shown, at $t_1$, control signals RST, DCG, TXS, TXL, and CONPD may be raised high to assert reset transistor 128, gain select transistor 114, transistor 104, transistor 108, and transistor 106, respectively. Asserting these transistors causes photodiode 102-1, photodiode 102-2, and floating diffusion region 112 to be reset to reset voltage levels (e.g., a reset voltage provided by bias voltage supply terminal 130). Control signal AB (and, accordingly, transistor 110) is omitted from the timing diagram of FIG. 4. However, it should be understood that if optional anti-blooming transistor 110 is included, control signal AB may be used to reset photodiode 102-1, photodiode 102-2, and/or floating diffusion region 112.

After photodiode 102-1, photodiode 102-2, and floating diffusion region 112 are reset at $t_1$, control signals RST, TXL, and CONPD may be lowered at $t_2$ (e.g., transistors 128, 108, and 106 are deasserted). Control signal DCG remains high such that transistor 114 remains asserted. Control signal TXS is set to an intermediate voltage level at $t_2$. When the charge levels in photodiode 102-1 exceed a given level (set by control signal TXS), charge may overflow from photodiode 102-1 into capacitor 116 (via path 134). TXS may remain at the intermediate level throughout the integration time, allowing overflow charge to flow from photodiode 102-1 to capacitor 116 throughout the integration time.

At $t_3$, the integration time may conclude and a readout time may begin. Control signal RS may be raised high to assert transistor 122 during the readout period. The readout may begin with an E2 sample that is obtained at $t_3$. The E2 readout may refer to readout of the overflow charge (that is stored at capacitor 116). The E2 readout may include readout of a sample level and a reset level for a double sampling.

In double sampling, a reset value and a signal value are obtained during readout. The reset value may then be subtracted from the signal value during subsequent processing to help correct for noise. The double sampling may be correlated double sampling (in which the reset value is sampled before the signal value) or uncorrelated double sampling (in which the reset value is sampled after the signal value is sampled, sometimes referred to as simply double sampling).

During the E2S sampling, conversion gain transistor 114 is asserted. This means that the E2S sample is a low conversion gain sample. After the E2S sampling (e.g., obtaining the E2 sample level), the reset control signal RST may be raised to assert reset transistor 128 at $t_4$ and control signal TXS may be lowered to deassert transistor 104. This resets the voltage at floating diffusion region 112 to a reset voltage. Next, the E2 reset level (E2R) may be sampled at $t_5$. During the E2R sampling, conversion gain transistor 114 is asserted. This means that the E2R sample is also a low conversion gain sample.

The E2R sample may be subtracted from the E2S sample to determine the amount of overflow charge at overflow capacitor 116. Because the sample level is obtained before the reset level, the E2 sampling is an example of uncorrelated double sampling (not correlated double sampling). There is therefore more noise than if correlated double sampling was performed. However, since the overflow charge is generated during relatively high light exposure conditions, the noise may not significantly impact the image data (e.g., the signal-to-noise ratio will remain sufficiently high). Similarly, in FIG. 4 the E2 sampling is shown as being a low conversion gain sampling. The low conversion gain sampling has more noise than a high conversion gain sampling. However, again, since the overflow charge is generated during relatively high light exposure conditions, signal-to-noise ratio will remain sufficiently high. If desired, correlated double sampling and/or high conversion gain readout may be used for the E2 sampling.

After the E2R sampling (e.g., obtaining the E2 reset level), the dual conversion gain control signal DCG may be lowered, deasserting transistor 114 and placing the pixel in a relatively high conversion gain mode. The reset transistor may be asserted at $t_6$ to reset the floating diffusion region 112. Then, the E1 reset level is sampled at $t_7$. The E1 readout may refer to readout of the charge from the photodiodes. The E1 readout may include readout of a reset level and a sample level for a correlated double sampling.

After the E1R sampling (e.g., obtaining the E1 reset level), control signals TXL and CONPD may be raised to assert transistors 108 and 106. This results in charge from both photodiodes 102-1 and 102-2 being transferred to floating diffusion region 112. Then, the E1 sample level (E1S) may be obtained at $t_9$. The E1R sample may be subtracted from the E1S sample to determine the amount of charge present in the photodiodes 102-1 and 102-2 at the end of the integration period. Because the sample level is obtained after the reset level, the E1 sampling is an example of correlated double sampling.

During the E1R and E1S samplings, conversion gain transistor 114 is deasserted. This means that the E1R and E1S samples are high conversion gain samples. The E1 sample may be used for low light conditions. Therefore, the reduced noise associated with the high conversion gain during the E1 sampling improves performance of the image sensor.

Including transistor 106 between photodiodes 102-1 and 102-2 such that the E1 readout includes charge from both photodiodes may improve signal-to-noise ratio (SNR) relative to arrangements where the charge is read from photodiodes 102-1 and 102-2 independently. However, depending upon the application of the particular image sensor, it should be understood that additional readout schemes may be used (e.g., reading overflow charge from capacitor 116 and charge from photodiode 102-1 simultaneously, independently reading charge from photodiode 102-1 and 102-2, etc.).

Figure 5:
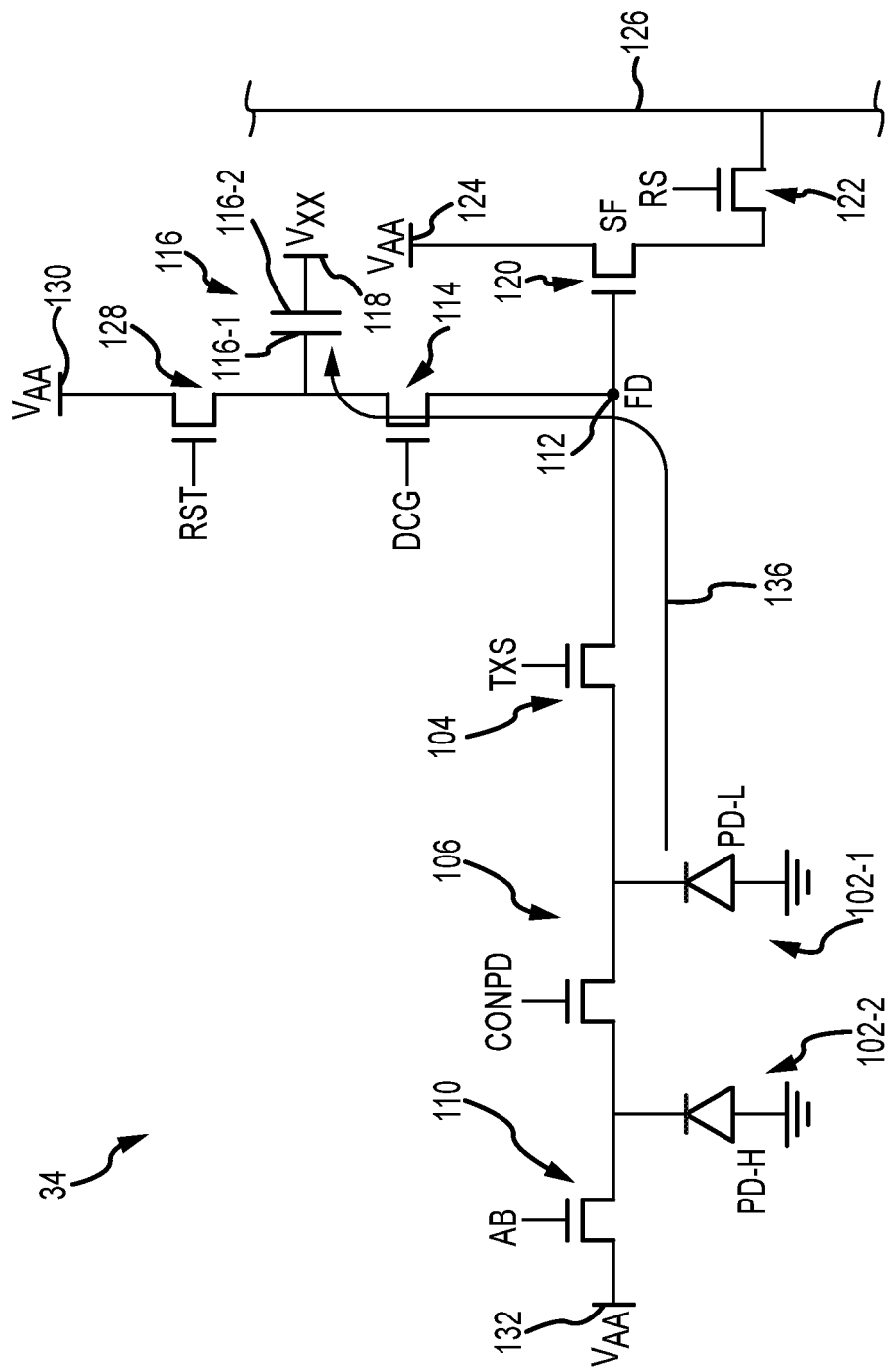
FIG. 5 is a circuit diagram of an illustrative imaging pixel that includes an overflow capacitor and a low-sensitivity photodiode that is adjacent to a floating diffusion region in accordance with an embodiment.

FIG. 5 is a circuit diagram of an imaging pixel with a similar arrangement to the imaging pixel of FIG. 3, but with the positions of the high-sensitivity and low-sensitivity photodiodes switched. For simplicity, duplicate descriptions for components already described in connection with FIG. 3 will not be reproduced here. In FIG. 5, transistor 104 is interposed between low-sensitivity photodiode 102-1 and floating diffusion region 112. Transistor 106 is still interposed between photodiode 102-1 and photodiode 102-2. Anti-blooming transistor 110 is interposed between photodiode 102-2 and bias voltage power supply terminal 132.

To allow overflow of charge from photodiode 102-1 to overflow to storage capacitor 116 and increase dynamic range, control signal TXS for threshold transistor 104 may be set to an intermediate voltage level during the integration time. When the charge levels in photodiode 102-1 exceed a given level (set by control signal TXS), charge may overflow into capacitor 116. For example, the overflow charge may follow path 136. Path 136 passes through floating diffusion region 112, whereas path 134 in FIG. 3 does not.

The arrangement of FIG. 5 may allow for an anti-blooming path for photodiodes 102-1 and 102-2 while omitting a transistor compared to the arrangement of FIG. 3 (e.g., transistor 108 from FIG. 3 is omitted in FIG. 5). Depending on the technology node limitations, pixel pitch, and other design constraints of a particular image sensor, the arrangement of FIG. 3 or FIG. 5 may be advantageous.

Figure 6:
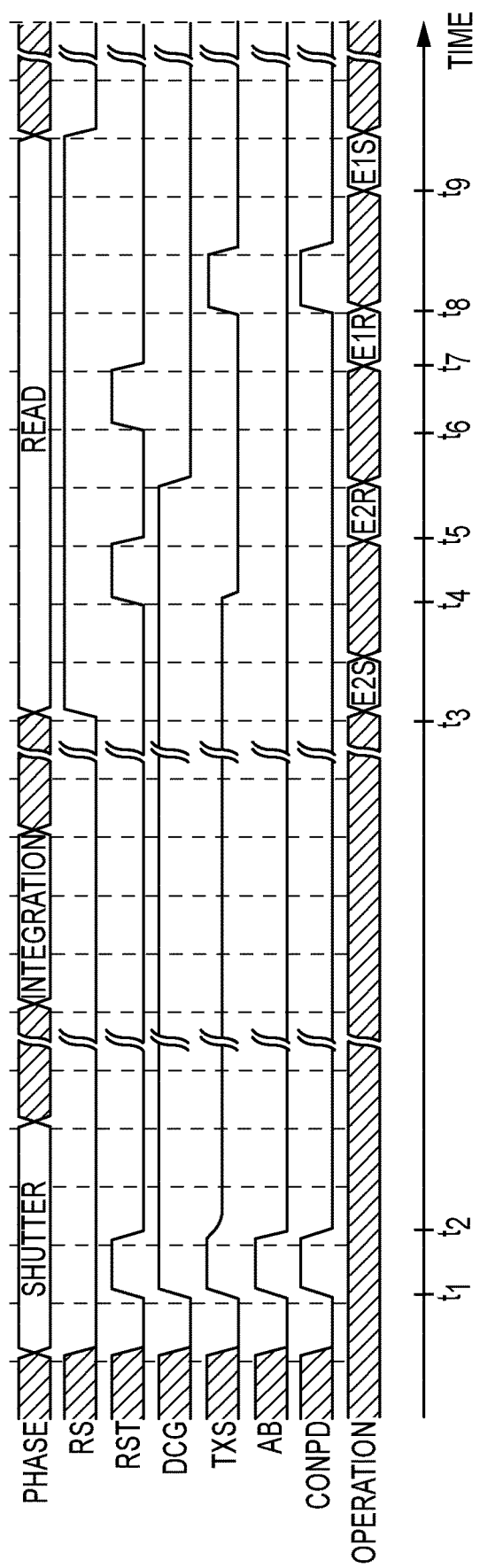
FIG. 6 is a timing diagram showing an illustrative method of operation for the imaging pixel of FIG. 5 in accordance with an embodiment.

FIG. 6 is a timing diagram showing an illustrative method of operating the pixel of FIG. 5. The timing diagram shown in FIG. 6 may be performed for each pixel during a respective frame. As shown, at $t_1$, control signals RST, DCG, TXS, AB, and CONPD may be raised high to assert reset transistor 128, gain select transistor 114, transistor 104, anti-blooming transistor 110, and transistor 106, respectively. Asserting these transistors will cause photodiode 102-1, photodiode 102-2, and floating diffusion region 112 to be reset to reset voltage levels (e.g., a reset voltage provided by bias voltage supply terminal 132).

After photodiode 102-1, photodiode 102-2, and floating diffusion region 112 are reset at $t_1$, control signals RST, AB, and CONPD may be lowered at $t_2$ (e.g., transistors 128, 110, and 106 are deasserted). Control signal DCG remains high such that transistor 114 remains asserted. Control signal TXS is set to an intermediate voltage level at $t_2$. When the charge levels in photodiode 102-1 exceed a given level (set by control signal TXS), charge may overflow from photodiode 102-1 into capacitor 116 (via path 136). TXS may remain at the intermediate level throughout the integration time, allowing overflow charge to flow from photodiode 102-1 to capacitor 116 throughout the integration time.

At $t_3$, the integration time may conclude and a readout time may begin. Control signal RS may be raised high to assert transistor 122 during the readout period. The readout may begin with an E2 sample that is obtained at $t_3$. The E2 readout may refer to readout of the overflow charge (that is stored at capacitor 116). The E2 readout may include readout of a sample level and a reset level for a double sampling.

After the E2S sampling (e.g., obtaining the E2 sample level), the reset control signal RST may be raised to assert reset transistor 128 at $t_4$. Control signal TXS may also be lowered to deassert transistor 104. This resets the voltage at floating diffusion region 112 to a reset voltage. Next, the E2 reset level (E2R) may be sampled at $t_5$.

The E2R sample may be subtracted from the E2S sample to determine the amount of overflow charge at overflow capacitor 116. In FIG. 6 the E2 sampling is shown as being an uncorrelated double sampling and low conversion gain sampling. If desired, correlated double sampling and/or high conversion gain readout may be used for the E2 sampling.

After the E2R sampling (e.g., obtaining the E2 reset level), the dual conversion gain control signal DCG may be lowered, deasserting transistor 114 and placing the pixel in a relatively high conversion gain mode. The reset transistor may be asserted at $t_6$ to reset the floating diffusion region 112. Then, the E1 reset level is sampled at $t_7$. The E1 readout may refer to readout of the charge from the photodiodes. The E1 readout may include readout of a reset level and a sample level for a correlated double sampling.

After the E1R sampling (e.g., obtaining the E1 reset level), control signals TXS and CONPD may be raised to assert transistors 104 and 106. This results in charge from both photodiodes 102-1 and 102-2 being transferred to floating diffusion region 112. Then, the E1 sample level (E1S) may be obtained at $t_9$. The E1R sample may be subtracted from the E1S sample to determine the amount of charge present in the photodiodes 102-1 and 102-2 at the end of the integration period. Because the sample level is obtained after the reset level, the E1 sampling is an example of correlated double sampling. During the E1R and E1S samplings, conversion gain transistor 114 is deasserted. This means that the E1R and E1S samples are high conversion gain samples.

Figure 7:
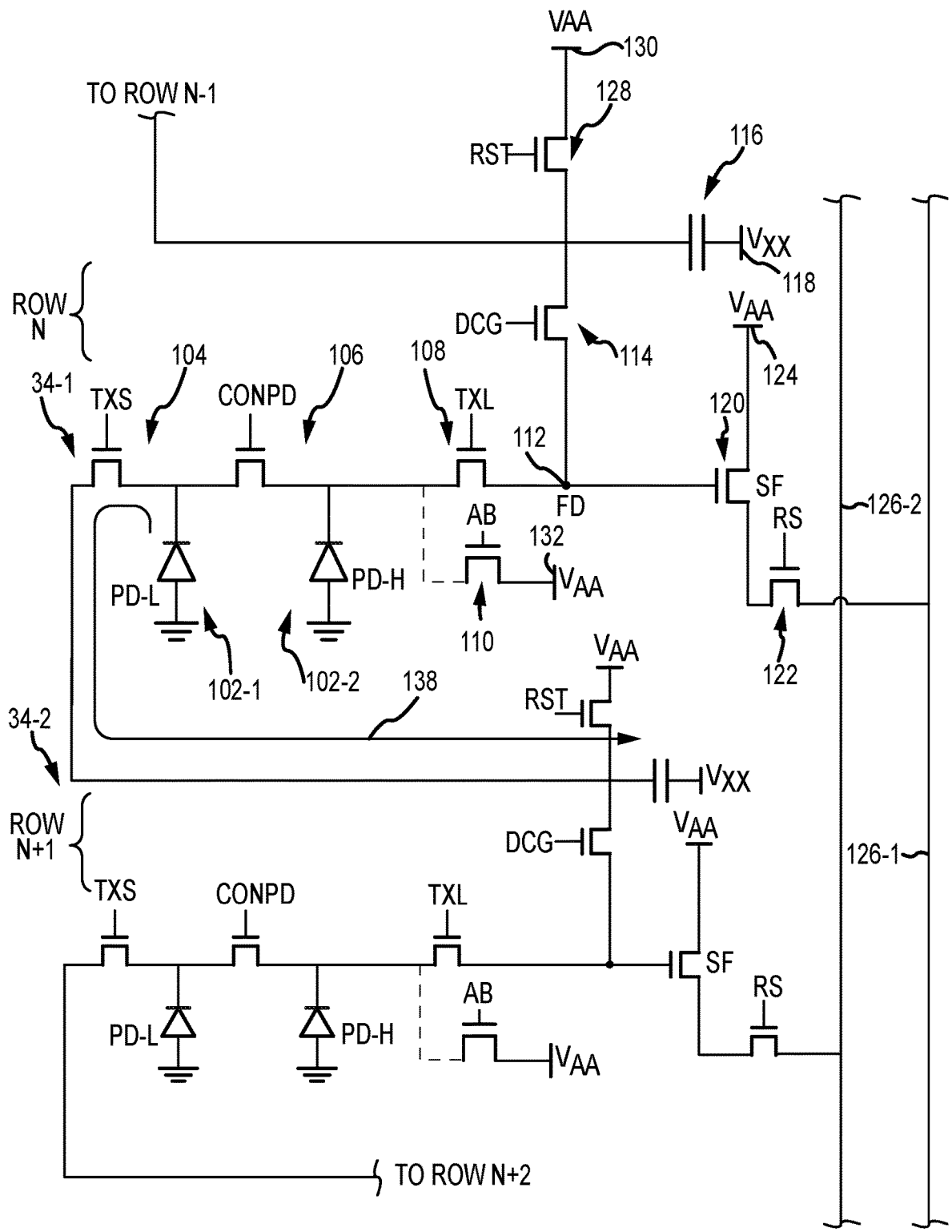
FIG. 7 is a circuit diagram of an illustrative imaging pixel that includes an overflow capacitor that receives overflow charge from an imaging pixel in a previous row in accordance with an embodiment.

FIG. 7 is a circuit diagram of an imaging pixel with a similar arrangement to the imaging pixel of FIG. 3, but with overflow charge transferred from a photodiode of a first row to a capacitor in a subsequent row. For simplicity, duplicate descriptions for components already described in connection with FIG. 3 will not be reproduced here, and duplicate labels for components in row n+1 will not be provided for components already labeled in row n.

In FIG. 7, each pixel 34 has the same arrangement as in FIG. 3. However, instead of transistor 104 being coupled between low-sensitivity photodiode 102-1 and capacitor 116 of the same pixel (as in FIG. 3), transistor 104 of pixel 34-1 (in row n) is coupled between photodiode 102-1 of pixel 34-1 and capacitor 116 of pixel 34-2 (in row n+1). Each pixel 34 in FIG. 7 may optionally have anti-blooming transistor 110, similar to as discussed in connection with FIG. 3.

To allow charge from photodiode 102-1 to overflow to storage capacitor 116 and increase dynamic range, control signal TXS for threshold transistor 104 may be set to an intermediate voltage level during the integration time. When the charge levels in photodiode 102-1 exceed a given level (set by control signal TXS), charge may overflow into capacitor 116 of the subsequent row. For example, the overflow charge may follow path 138.

Therefore, at the end of a given integration time, the overflow charge associated with row n will be stored in the storage capacitor 116 of row n+1. For faster readout, the E1 and E2 readouts may be performed simultaneously. In other words, the overflow charge may be read from row n+1 using column line 126-2. The charge from photodiodes 102-1 and 102-2 may be read from row n using a column line 126-1. Each column of pixels may therefore have two column lines instead of one, with each one of the two column lines being coupled to every other row of pixels. The first of the two column lines may be coupled to all of the even rows in the array whereas the second of the two column lines may be coupled to all of the odd rows in the array.

The arrangement of FIG. 7 may allow for faster frame rate, because the E1 and E2 sampling is performed simultaneously. Depending on the technology node limitations, pixel pitch, and other design constraints of a particular image sensor, the arrangement of FIG. 3, FIG. 5, or FIG. 7 may be advantageous.

Figure 8:
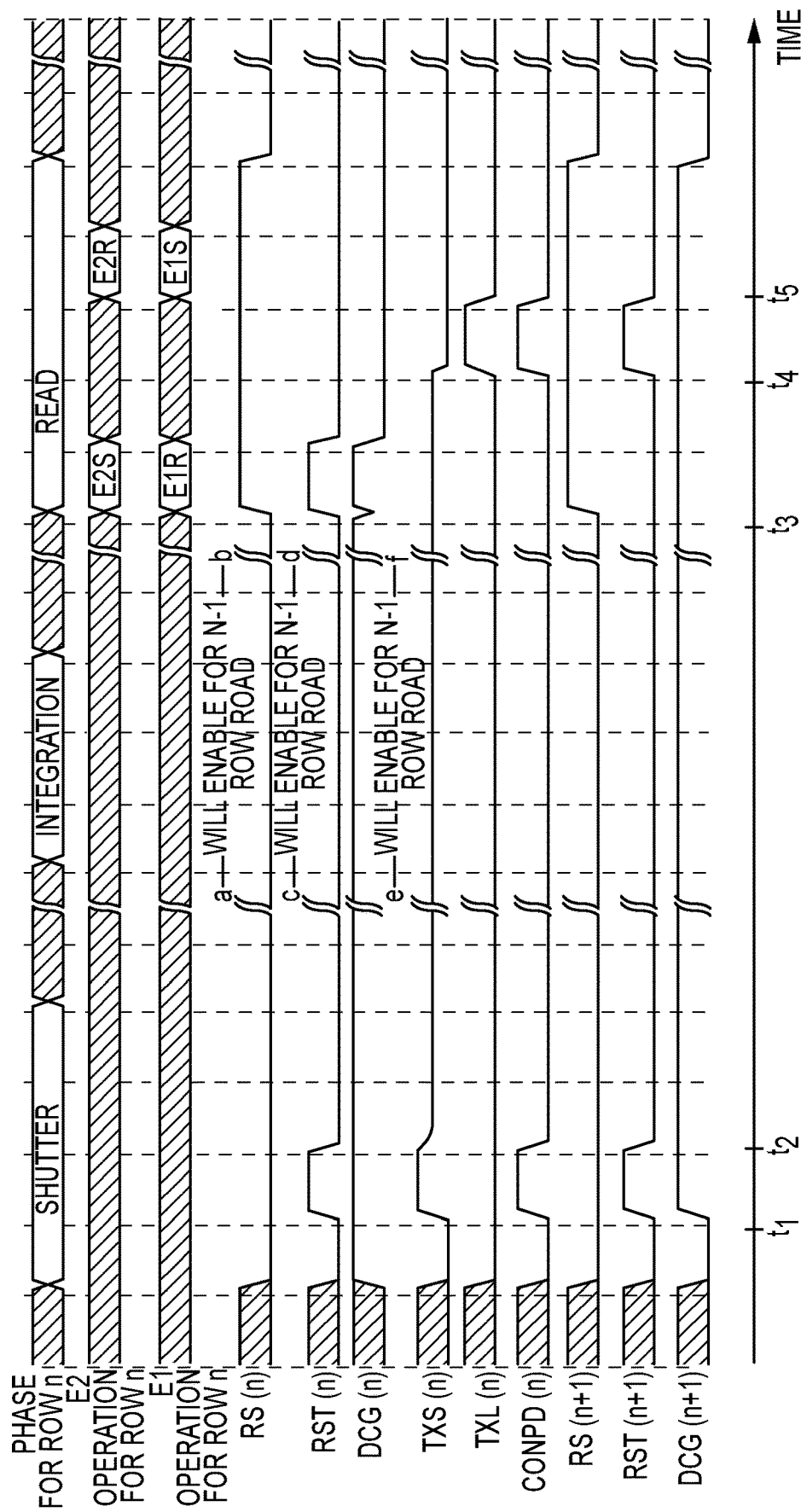
FIG. 8 is a timing diagram showing an illustrative method of operation for the imaging pixel of FIG. 7 in accordance with an embodiment.

FIG. 8 is a timing diagram showing an illustrative method of operating the pixel of FIG. 7. The timing diagram shown in FIG. 8 may be performed for each pixel during a respective frame. Control signals for transistors in row n are labeled (n) whereas control signals for transistors in row n+1 are labeled (n+1).

As shown, at $t_1$, control signals RST(n), DCG(n), TXS(n), CONPD(n), RST (n+1), and DCG (n+1) may be raised high to assert reset transistor 128, gain select transistor 114, transistor 104, and transistor 106 in row n as well as transistors 128 and 114 in row n+1. Asserting these transistors will cause photodiode 102-1, photodiode 102-2, and floating diffusion region 112 in row n to be reset to reset voltage levels (e.g., a reset voltage provided by bias voltage supply terminal 130). Additionally, floating diffusion region 112 in row n+1 will be reset to a reset voltage level. Although not shown in the example of FIG. 8, if the pixels include optional anti-blooming transistor 110, anti-blooming control signal AB may be used to assert transistor 110 and reset photodiode 102-1, photodiode 102-2, and/or floating diffusion region 112.

After the reset, control signals RST(n), CONPD(n), and RST (n+1) may be lowered at $t_2$. Control signals DCG(n) and DCG(n+1) remain high such that transistor 114 in rows n and n+1 remain asserted. Control signal TXS(n) is set to an intermediate voltage level at $t_2$. When the charge levels in photodiode 102-1 exceed a given level (set by control signal TXS(n)), charge may overflow from photodiode 102-1 in row n into capacitor 116 in row n+1 (via path 138). TXS(n) may remain at the intermediate level throughout the integration time, allowing overflow charge to flow from photodiode 102-1 in row n to capacitor 116 in row n+1 throughout the integration time.

At $t_3$, the integration time may conclude and a readout time may begin. Control signal RS(n) and RS(n+1) may be raised high to assert transistor 122 in rows n and n+1 during the readout period. At $t_3$, control signal RST(n) is raised to assert transistor 128 in row n. This resets floating diffusion 112 in row n. The reset voltage level for E1 (e.g., E1R) is then sampled using column readout line 126-1. Simultaneously, the sample level for E2 (e.g., E2S) is sampled from capacitor 116 in row n+1 using column readout line 126-2.

At $t_4$, TXL(n) and CONPD(n) may be raised high to assert transistors 106 and 108 in row n. This causes charge from photodiodes 102-1 and 102-2 to be transferred to floating diffusion region 112 in row n for readout. Additionally at $t_4$, RST(n+1) is raised high to assert reset transistor 128 in row n+1, thus resetting floating diffusion region 112 in row n+1. At $t_5$, the sample level for E1 (e.g., the charge from photodiodes 102-1 and 102-2) is obtained using column output line 126-1. Simultaneously, the reset level for E2 is obtained using column output line 126-2. The reset levels may be subtracted from the sample levels similar to as already discussed above.

The readouts of FIG. 8 may ultimately have the same characteristics as in FIGS. 4 and 6. In other words, the E1 readout is a correlated double sampling readout of charge from photodiodes 102-1 and 102-2 with a high conversion gain and the E2 readout is a double sampling readout of overflow charge with a low conversion gain. However, in FIG. 8 the E1 and E2 readouts are performed simultaneously using two different column lines, allowing for an increase in the frame rate.

An image sensor with pixels of the type discussed in FIGS. 7 and 8 may have an extra row of pixels at the bottom of the array of pixels to allow for readout from the last row of pixels using the same scheme as the other rows of pixels. This extra row of pixels may sometimes be referred to as a row of dummy pixels (because the dummy pixels are only used for readout and do not actually obtain image data). The dummy pixels may have the same circuit arrangement as the other pixels in the array. Alternatively, the dummy pixels may include only the components required for readout of the previous row's overflow charge (e.g., the photodiodes may be omitted).

The foregoing is merely illustrative of the principles of this invention and various modifications can be made by those skilled in the art. The foregoing embodiments may be implemented individually or in any combination.

What is claimed is:

1. An imaging pixel comprising:
   a first photodiode;
   a second photodiode;
   a first transistor that is coupled between the first photodiode and the second photodiode;
   a floating diffusion region;
   a second transistor that is coupled between the floating diffusion region and the second photodiode;
   a capacitor;
   a third transistor that is coupled between the first photodiode and the capacitor; and
   a fourth transistor that is coupled between the floating diffusion region and the capacitor.

2. The imaging pixel defined in claim 1, wherein the first photodiode has a different sensitivity than the second photodiode.

3. The imaging pixel defined in claim 1, wherein first photodiode has a first sensitivity, the second photodiode has a second sensitivity, and the second sensitivity is greater than the first sensitivity.

4. The imaging pixel defined in claim 3, wherein the second sensitivity is at least two times greater than the first sensitivity.

5. The imaging pixel defined in claim 1, wherein the first photodiode is configured to generate first charge in response to incident light, wherein the second photodiode is configured to generate second charge in response to incident light, and wherein a first subset of the first charge is configured to overflow from the first photodiode to the capacitor through the third transistor.

6. The imaging pixel defined in claim 5, wherein a second subset of the first charge remains in the first photodiode until the end of an integration time and wherein, during a readout period, the first and second transistors are configured to be asserted to transfer the second subset of the first charge and the second charge to the floating diffusion region.

7. The imaging pixel defined in claim 5, further comprising:
   a readout circuit configured to:
      sample the first subset of the first charge;
      after sampling the first subset of the first charge, sample a first reset level associated with the floating diffusion region;
      after sampling the first reset level associated with the floating diffusion region, sample a second reset level associated with the floating diffusion region; and
      after sampling the second reset level associated with the floating diffusion region, sample a second subset of the first charge and the second charge.

8. The imaging pixel defined in claim 1, further comprising:
- a reset transistor that is coupled between the capacitor and a bias voltage supply terminal;
- a source follower transistor having a gate that is coupled to the floating diffusion region;
- a column output line; and
- a row select transistor coupled between the column output line and the source follower transistor.

9. An imaging pixel comprising:
- a first photodiode having a first sensitivity;
- a second photodiode having a second sensitivity that is greater than the first sensitivity;
- a first transistor that is coupled between the first photodiode and the second photodiode;
- a floating diffusion region;
- a second transistor that is coupled between the floating diffusion region and the first photodiode;
- a capacitor; and
- a conversion gain transistor that is coupled between the floating diffusion region and the capacitor.

10. The imaging pixel defined in claim 9, wherein the second sensitivity is at least two times greater than the first sensitivity.

11. The imaging pixel defined in claim 9, further comprising:
- a bias voltage supply terminal; and
- an anti-blooming transistor that is coupled between the second photodiode and the bias voltage supply terminal.

12. The imaging pixel defined in claim 9, further comprising:
- a reset transistor that is coupled to the capacitor and the conversion gain transistor.

13. The imaging pixel defined in claim 9, further comprising:
- a reset transistor that is coupled between the capacitor and a bias voltage supply terminal;
- a source follower transistor having a gate that is coupled to the floating diffusion region;
- a column output line; and
- a row select transistor coupled between the column output line and the source follower transistor.

14. The imaging pixel defined in claim 9, wherein the first photodiode is configured to generate first charge in response to incident light, wherein the second photodiode is configured to generate second charge in response to incident light, and wherein a first subset of the first charge is configured to overflow from the first photodiode to the capacitor through the second transistor.

15. The imaging pixel defined in claim 14, wherein a second subset of the second charge remains in the first photodiode until the end of an integration time and wherein, during a readout period, the first and second transistors are configured to be asserted to transfer the second subset of the first charge and the second charge to the floating diffusion region.

16. The imaging pixel defined in claim 14, further comprising:
- a readout circuit configured to:
  - sample the first subset of the first charge;
  - after sampling the first subset of the first charge, sample a first reset level associated with the floating diffusion region;
  - after sampling the first reset level associated with the floating diffusion region, sample a second reset level associated with the floating diffusion region; and
  - after sampling the second reset level associated with the floating diffusion region, sample a second subset of the first charge and the second charge.

17. An image sensor comprising an array of imaging pixels that includes a first imaging pixel in a given row, the first imaging pixel comprising:
- a first photodiode;
- a second photodiode;
- a first transistor that is coupled between the first photodiode and the second photodiode;
- a floating diffusion region;
- a second transistor that is coupled between the floating diffusion region and the second photodiode; and
- a third transistor that is coupled between the first photodiode and a capacitor of a second imaging pixel, wherein the second imaging pixel is in a row that is subsequent to the given row.

18. The image sensor defined in claim 17, wherein the first imaging pixel comprises:
- an additional capacitor; and
- a fourth transistor that is coupled between the additional capacitor and the floating diffusion region.

19. The image sensor defined in claim 18, wherein the additional capacitor is coupled to an additional photodiode of a third imaging pixel by a fifth transistor and wherein the third imaging pixel is in a row that is previous to the given row.

20. The image sensor defined in claim 17, wherein a first sensitivity of the first photodiode is lower than a second sensitivity of the second photodiode.

* * * * *